United States Patent [19]

Miller et al.

[11] Patent Number: 4,893,165
[45] Date of Patent: Jan. 9, 1990

[54] BIPOLAR TRANSISTOR CONTROLLABLE BY FIELD EFFECT

[75] Inventors: Gerhard Miller, Penzing; Helmut Strack; Jenoe Tihanyi, both of Munich, all of Fed. Rep. of Germany

[73] Assignee: Siemens Aktiengesellschaft, Berlin and Munich, Fed. Rep. of Germany

[21] Appl. No.: 313,045

[22] Filed: Feb. 21, 1989

[30] Foreign Application Priority Data

Feb. 24, 1988 [DE] Fed. Rep. of Germany ....... 3805799

[51] Int. Cl.⁴ ...................... H01L 29/78; H01L 29/74
[52] U.S. Cl. ........................................ 357/43; 357/23.4; 357/38; 357/67; 357/71; 357/86
[58] Field of Search ................ 357/23.4, 38, 43, 86

[56] References Cited

U.S. PATENT DOCUMENTS

| | | | |
|---|---|---|---|
| 4,443,931 | 4/1984 | Baliga et al. | 357/38 |
| 4,466,176 | 8/1984 | Temple | 357/23.4 |
| 4,495,513 | 1/1985 | Descamps | 357/43 |
| 4,620,211 | 10/1986 | Baliga et al. | 357/38 |
| 4,779,123 | 10/1988 | Bencuya et al. | 357/23.4 |
| 4,821,095 | 4/1989 | Temple | 357/23.4 |

FOREIGN PATENT DOCUMENTS 0148065 12/1984 European Pat. Off. .
2088631 11/1981 United Kingdom .

OTHER PUBLICATIONS

Gary M. Dolny, "COMFET-The Ultimate Power Device", Nov. 1985, pp. 121-128.
Power Control, Jan. 12, 1984, pp. 248-250, Electronic Design.
Jerry G. Fossum, "Charge-Control Analysis of the COMFET Turn-Off Transient", IEEE Transactions of Electron Devices, vol. ED-33, No. 9, Sep. 1986, pp. 1377-1382.

Primary Examiner—Gene M. Munson
Attorney, Agent, or Firm—Hill, Van Santen, Steadman & Simpson

[57] ABSTRACT

A field effect controllable bipolar transistor or isolated gate bipolar transistor (IGBT) has a drastically reduced inhibit delay charge, given identical on-state behavior, in that the anode zone has a thickness of less that 1 micrometer, it is doped with implanted ions with a dose of about $1 \times 10^{12}$ through $1 \times 10^{15}$ cm$^{-2}$, and in that the life time of the minority charge carriers in the inner zone amounts to at least 1 microsecond.

11 Claims, 2 Drawing Sheets

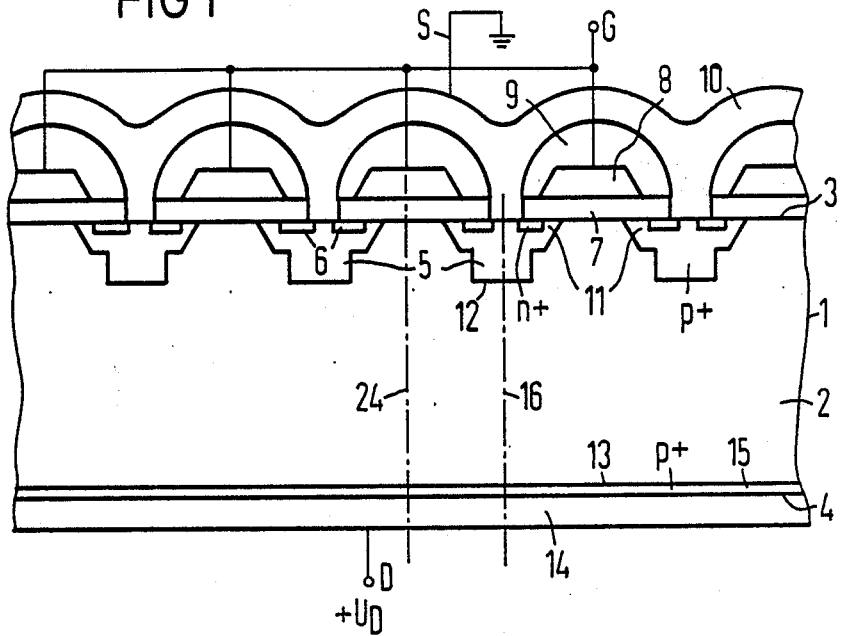
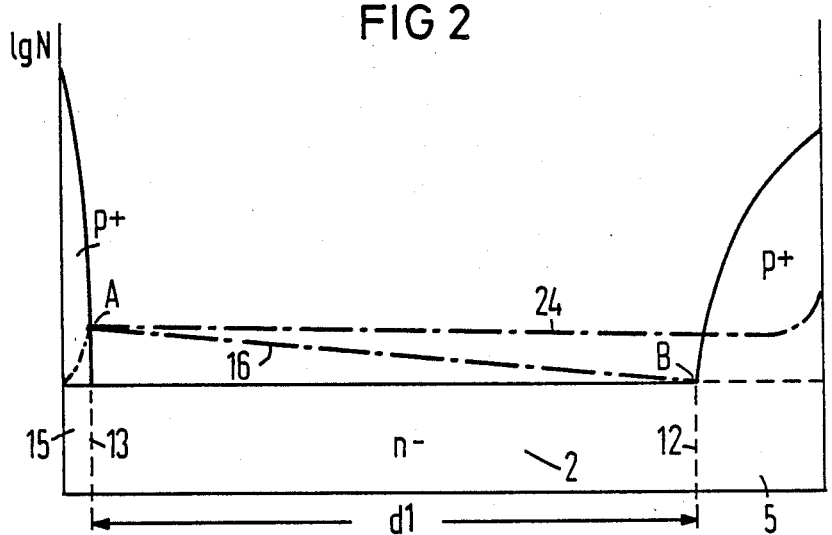

BIPOLAR TRANSISTOR CONTROLLABLE BY FIELD EFFECT

BACKGROUND OF THE INVENTION

1. Field of the Invention

The present invention is directed generally to a bipolar transistor which is controllable by field effect, and more particularly to such transistor having a semiconductor body with an inner zone and a zone at a drain side which has a higher doping than the inner zone and is of an opposite conductivity type.

2. Description of the Related Art

Bipolar transistors of the type related to the present invention are described, for example, in an article entitled, "COMFET-The Ultimate Power Device" in the periodical SOLID STATE TECHNOLOGY, Nov. 1985, pages 121-128. The disclosed device has a source side which is formed like a power MOSFET; however, at its anode side, the device has a fourth zone which is of a conductivity type opposite to that of the inner zone. The device, thus, has a structure like that of a thyristor and is provided with a shunt at a cathode side which increases what is referred to as the latching current of the thyristor so that the latching current does not reach the operating conditions of the component. As in a thyristor, but by contrast to the operation of a power MOSFET, both types of charge carriers participate in current transportation in the disclosed device. On one hand, this produces the advantage of a low on-state dc resistance, while, on the other hand, it yields the disadvantage of recovery, charge which is felt in what is referred to as a "tail" current during shut-off. Such tail current delays shutoff of the device.

According to various proposals, the recovery charge is reduced by, for example, recombination centers or by imperfections or damage in the lattice structure caused by irradiation. A further proposal is to insert a buffer zone between the inner zone and the anode zone. The buffer zone is of the same conductivity type as the inner zone but has a higher doping concentration than the inner zone (see, for example, the chapter entitled, "Power Control" in the periodical ELECTRONIC DESIGN, 12 Jan. 1984, pages 248 and 249).

It is possible to reduce the recovery charge and, thus, to diminish a shut-off time with the above described measures or with a combination of both such measures.

SUMMARY OF THE INVENTION

An object of the present invention is to further reduce the recovery charge and shorten the shut-off time with simple means. This and other objects are achieved by providing a bipolar transistor controllable by field effect having the zone at the drain side of a thickness of less than one micrometer; by doping the drain side zone with a dose of between $1 \times 10^{12}$ and $1 \times 10^{15}$ cm$^{-2}$ with implanted ions; and by providing that the life time of the minority charge carriers in the inner zone amounts to at least 1 microsecond.

Further developments and advantage of the invention are that lattice damage caused in the zone at the drain side by the ion implantation is cured at a temperature below 600 degrees C. Alternately, lattice damage in the zone at the drain side caused by the ion implantation is cured by rapid thermal annealing. In one embodiment, the zone at the drain side is contacted by a metal layer and the metal layer is contacted to the semiconductor body by alloying. An improvement on such embodiment is that the metal layer is composed of aluminum.

In another embodiment, the drain side zone is contacted by a metal layer and the metal layer is connected to the semiconductor body via a metal silicide layer. In this embodiment, the metal layer is composed of one of the metals platinum, titanium, tungsten, or molybdenum.

BRIEF DESCRIPTION OF THE DRAWINGS

FIG. 1 is a cross section through an isolated gate bipolar transistor according to the principles of the present invention;

FIG. 2 is a graph showing the doping and the charge carrier distribution in the current-conducting condition for the insulated gate bipolar transistor of FIG. 1;

DESCRIPTION OF THE PREFERRED EMBODIMENTS

Figure 3:
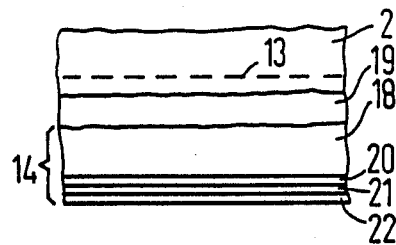
FIG. 3 is a fragmentary cross section of a contact arrangement for the zone at the drain side of the device of FIG. 1.

A bipolar transistor as shown in FIG. 1 is controllable by a field effect and is referred to as an IGBT (isolated gate bipolar transistor). The device includes a semiconductor body 1 having an n-doped inner zone 2 with a doping concentration of, for example, $1-2 \times 10^{14}$cm$^{-3}$. The semiconductor body 1 has a surface 3 at a source side and a surface 4 at a drain side. An inner zone 2 within the semiconductor body 1 extends up to the source side surface 3. Adjacent the source side surface 3, base zones 5 which are highly p-doped are embedded into the inner zone 2. The base zones 5 form p-n junctions 12 with the inner zone 2.

A highly n-doped source zone 6 is embedded in every base zone 5. The doping of the source zones 6 is higher than that of the base zones 5. An insulating layer 7 is seated on the surface 3 of the semiconductor body and gate electrodes 8 are connected in parallel to one another arranged on the insulating layer 7. The gate electrodes 8 cover part of the base zones 5 that reach the surface 3 and form channel zones 11 there. The gate electrodes 8 are covered by a further insulating layer 9. Openings are provided in the insulating layers 7 and 9 through which the source zones 6 and the base zones 5 are contacted by a source electrode 10 lying on the insulating layer 9. The source electrode 10 is preferably composed of aluminum. The common contacting of the zones 5 and 6 by the source electrode 10 represents a strong shunt.

The inner zone 2 is followed by a p-layer 15 at the drain side 4. The p-layer 15 is significantly more highly doped than the inner zone 2. A p-n junction 13 lies between the zone 15 or layer at the drain side 4 and the inner zone 2. The zone 15 is contacted by a drain electrode 14.

The zone or layer 15 at the drain side 4 as a thickness of less than one micrometer and, preferably, a thickness of about 0.1 micrometer. The zone 15 is produced in a known way, for example, by boron ion implantation having a dose of between $1 \times 10^{12}$ and $1 \times 10^{15}$cm$^{-2}$.

Preferably, the dose for implantation is between $1\times10^{13}$ and $1\times10^{14}$ cm$^{-2}$ and at an energy of 45 keV. When other ions are implanted, then the energy is set so that the afore-mentioned penetration depth derives.

The silicon of the semiconductor body 1 is of such a nature that the life time of at least 1 microsecond for the minority charge carriers coming form the zones 5 and 15 derives in the inner zone 2. This condition can generally be already met without further ado since the semiconductor body 1 is separated from a traditional zone-drawn or crucible-drawn single-crystal rod of silicon and is not additionally doped with substances forming recombination centers during further processing. The afore-mentioned life time is of a duration such that little or no charge carrier recombination occurs in the inner zone, for example, in an IGBT designed for an inhibit voltage of 1000 volts having an inner zone thickness of, for example, 200 micrometers. The life time, however, may also be significantly longer such as, for example, on the order of magnitude of 100 microseconds. It is sufficient, however, that a 10 microsecond life time be provided given a thickness of 200 micrometers since the transition time is only about 2 microseconds.

In the diagram of FIG. 2 is shown a doping curve in solid line and the concentration of the free charge carriers in the on-state in broken lines. The doping in the inner zone 2, which is represented by the horizontal solid line beneath which is marked n−, is constant and is established by the basic doping of the semiconductor material. The drain side zone 15, which is marked p+, has an edge concentration which is higher by a number of powers of 10 than the inner zones 2, as does each of the base zones 5. Whereas the base zones 5 can be produced, for example, by ion implantation and subsequent drive-in, the drain side zone 15 is produced only by implanting ions without a following drive-in. A temperature treatment at less than 600 degrees C. is merely subsequently carried out wherein the dopant does not yet significantly diffuse into the semiconductor body 1. RTA (rapid temperature annealing) with a laser or with strobe flashes can also be used instead of temperature treatment below 600 degrees C. Only a part of the crystal lattice damage produced by the ion implantation is cured with both methods. Together with the extremely slight thickness of the zone 15, this leads to an extremely low GUMMEL number (the quotient of the emitter charge and the emitter diffusion constant) for the emitter and thereby leads to a low emitter efficiency for the zone 15.

The boost of the minority charge carriers above the basic doping level in the inner zone 2 is thus relatively slight, as shown at point A on the graph of FIG. 2. However, since the inner zone 2 comprises extremely few recombination centers (no additional recombination centers), the density of the free charge carriers essentially linearly decreases over the thickness of the inner zone 2 to a density of 0 at the p-n junction 12 at the source side that is always inhibited. This is illustrated by the broken line 16 in FIG. 2 which slopes downwardly to the right until p =n at point b. The line 16 is FIG. 2 corresponds to the characteristics measured along broken line 16 in FIG. 1. Concentration of the free charge carriers in the section under the gate electrode, as shown by broken line 24 in FIG. 2 corresponding to line 24 in FIG. 1, differs in the on-state in that the concentration of the free charge carriers p =n is boosted at the source side.

Figure 4:
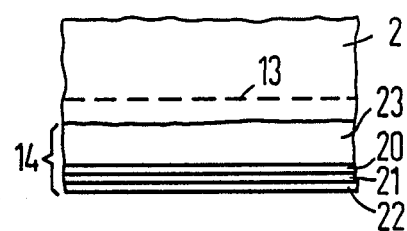
FIG. 4 is a fragmentary cross section through a third exemplary embodiment of the contact arrangement at the drain side.

The zone 15 is contacted by a drain contact 14 whose structure is shown in FIGS. 3 and 4. For example, the contact is produced by sputtering an aluminum layer 18 which is partially alloyed into the semiconductor body 2. An aluminum-silicon alloy 19 is formed therebetween which does not penetrate up to the p-n junction 13, provided the process is controlled appropriately. For example, this can be achieved by heating to 450 degrees C. for 30 minutes. The aluminum layer 18 is then provided with a multi-layer contact in a known fashion which, for example, is composed of a titanium layer 20, a nickel layer 21 and a silver layer 22.

Referring to FIG. 4, the contact 14 is connected to the semiconductor body 2 through a metal silicide. To this end, for example, a layer of platinum is applied on the surface 4 of the semiconductor body 2; then a platinum silicide layer 23 is formed by annealing. By sputtering an appropriately thin platinum layer onto the semiconductor, the annealing process is controlled so that the platinum silicide layer 23 does not extend up to the p-n junction 13 after a temperature treatment at between 450 through 470 degrees C. for about one hour. The platinum silicide layer 23 is then contacted by a multi-layer contact formed, for example, of titanium 20, nickel 21 and silver 22 as in the example shown in FIG. 3.

Figure 5:
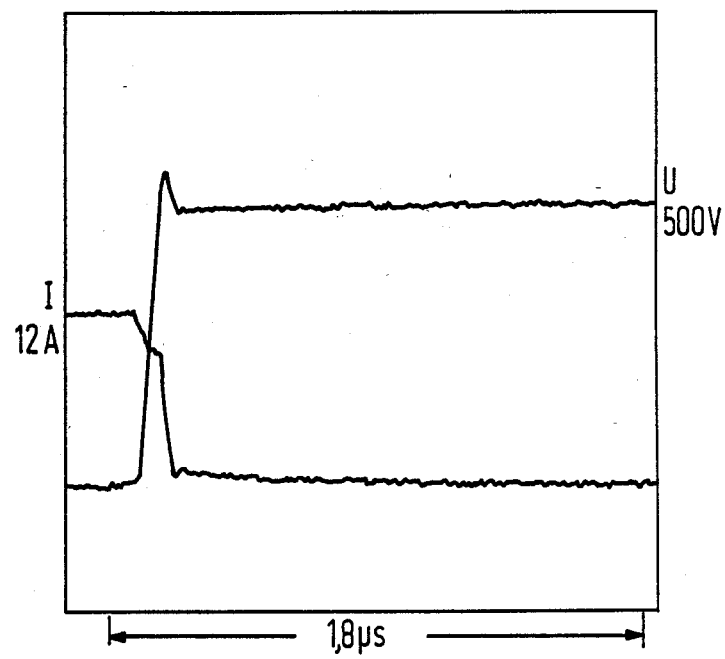
FIG. 5 is a graph showing a curve of the current and of the voltage during shut-off for the device of the present invention.

With reference to FIG. 5, the IGBT of the invention has a shut-off current I and a shut-off voltage U that are compared to one another at a shut-off time t. The present device does not have the tail current during shut-off which is found in the known devices. It can be seen that the dissipation energy at shut-off is extremely low. In the illustrated example, the dissipating energy is about 0.68 mWs. The on-state behavior for the device is the same as in the known devices.

The invention has been disclosed with reference to an nchannel IGBT. Of course, the principles of the invention can also be utilized for a p-channel IGBT wherein an n+ zone is used instead of a p+ drain side zone 15. For example, the drain side zone can be produced by implantation of phosphorous ions. Subsequently, a multi-layer contact is applied which is composed of, for example, platinum silicide, titanium, nickel, silver.

Although other modifications and changes may be suggested by those skilled in the art, it is the intention of the inventors to embody within the patent warranted hereon all changes and modifications as reasonably and properly come within the scope of their contribution to the art.

We claim:

1. An improved field-effect controllable bipolar transistor having a field effect transistor structure with a source side and a drain side, the improvement, comprising:

a semiconductor body on which the field effect transistor structure is formed having an inner zone in which life time of minority charge carriers in at least 1 microsecond, a zone at the drain side of said semiconductor body with higher doping than said inner zone and of an opposite conductivity type, said drain side zone being less than 1 micrometer thick and being doped with implanted ions of a dose between $1\times10^{12}$ and $1\times10^{15}$ cm$^{-2}$.

2. An improved field-effect controllable bipolar transistor as claimed in claim 1, wherein said zone at the drain side has lattice damage caused by implantation and said lattice damage is cured at a temperature below 600 degrees C.

3. An improved field-effect controlled bipolar transistor as claimed in claim 1, wherein said zone at the drain side has lattice damage caused by implantation and said lattice damage is cured by rapid thermal annealing.

4. An improved field-effect controlled bipolar transistor as claimed in claim 1, further comprising:
   a metal layer contacting said zone at the drain side, said metal layer being connected to said semiconductor body by alloying.

5. An improved field effect controllable bipolar transistor as claimed in claim 4, wherein said metal layer is of aluminum.

6. An improved field effect controllable bipolar transistor as claimed in claim 1, further comprising:
   a metal layer contacting said zone at the drain side; and
   a metal silicide layer connecting said metal layer to said semiconductor body.

7. An improved field-effect controllable bipolar transistor as claimed in claim 6, wherein said metal layer is composed of a metal selected from the group consisting of: platinum, titanium, tungsten, and molybdenum.

8. A bipolar transistor controllable by field effect, comprising:
   a semiconductor body having an inner zone and a source side and a drain side, said inner zone being doped to provide a minority charge carrier life expectancy of at least 10 microseconds;
   a base zone in said semiconductor body at said source side and being doped to form a p-n junction with said inner zone;
   a source zone embedded in said base zone and having a higher doping concentration than said base zone;
   a source side electrode connected to said base zone and said source zone;
   a drain side zone at said drain side of said semiconductor body and having a higher doping concentration than said of said semiconductor body and having a higher doping concentration than said inner zone, said drain side zone being doped with an opposite conductivity type than said inner zone and having a thickness of up to about one micrometer, said drain said zone being doped with a dose of between $10^{12}$ through $10^{15}$ implanted ions per square centimeter.

9. A bipolar transistor controllable by field effect as claimed in claim 8, wherein said drain side zone has a thickness of about 0.1 micrometer.

10. A bipolar transistor as claimed in claim 8, wherein said drain side zone is produced by an implantation dose of between $10^{13}$ and $10^{14}$ ions per square centimeter at an energy of 45 keV.

11. A bipolar transistor as claimed in claim 8, wherein said inner zone has a thickness of about 200 micrometer.

* * * * *